(12) United States Patent
Lin et al.

(10) Patent No.: US 11,398,393 B2
(45) Date of Patent: *Jul. 26, 2022

(54) VAPOR SHIELD REPLACEMENT SYSTEM AND METHOD

(71) Applicant: TAIWAN SEMICONDUCTOR MANUFACTURING COMPANY, LTD., Hsinchu (TW)

(72) Inventors: Ping-Tse Lin, Hsinchu (TW); Chun-Chih Lin, Taipei (TW); Wen-Cheng Lien, Hsinchu (TW); Monica Ho, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/074,105

(22) Filed: Oct. 19, 2020

(65) Prior Publication Data
US 2021/0035829 A1    Feb. 4, 2021

Related U.S. Application Data

(63) Continuation of application No. 15/798,827, filed on Oct. 31, 2017, now Pat. No. 10,811,285.

(Continued)

(51) Int. Cl.
| | |
|---|---|
| *H01L 21/67* | (2006.01) |
| *G01B 11/14* | (2006.01) |
| *G01N 21/84* | (2006.01) |
| *H01L 21/268* | (2006.01) |
| *H01L 21/324* | (2006.01) |

(Continued)

(52) U.S. Cl.
CPC .......... *H01L 21/67115* (2013.01); *F16P 1/06* (2013.01); *G01B 11/0633* (2013.01); *G01B 11/14* (2013.01); *G01N 21/8422* (2013.01); *H01L 21/268* (2013.01); *H01L 21/324* (2013.01); *H01L 21/67248* (2013.01); *H01L 21/67253* (2013.01); *G01N 2021/8427* (2013.01)

(58) Field of Classification Search
CPC ............. H01L 21/67115; H01L 21/268; H01L 21/324; H01L 21/67248; F16P 1/06; G01B 11/14; G01N 21/8422; G01N 2021/8427
USPC ................................ 356/446, 382, 434, 355
See application file for complete search history.

(56) References Cited

U.S. PATENT DOCUMENTS

| | | | | |
|---|---|---|---|---|
| 4,828,391 A | * | 5/1989 | Zultzke | ................. C23C 14/547 356/632 |
| 4,878,755 A | * | 11/1989 | Siegmund | ............... C23C 14/54 356/632 |

(Continued)

*Primary Examiner* — Isiaka O Akanbi
(74) *Attorney, Agent, or Firm* — Hauptman Ham, LLP

(57) ABSTRACT

A multi-shield plate includes a plate having a substantially flat upper surface and a substantially flat lower surface, a plurality of first windows formed in the plate and extending through the plate from the upper surface to the lower surface, and a plurality of vapor shields mounted to the plate, each vapor shield of the plurality of vapor shields configured to prevent passage of a vapor through a corresponding window of the plurality of windows. The multi-shield plate includes an aperture formed in the plate, the aperture aligned with a first window of the plurality of windows along an axis corresponding to the upper surface.

20 Claims, 6 Drawing Sheets

Related U.S. Application Data

(60) Provisional application No. 62/512,987, filed on May 31, 2017.

(51) Int. Cl.
*F16P 1/06* (2006.01)
*G01B 11/06* (2006.01)

(56) References Cited

U.S. PATENT DOCUMENTS

| | | | |
|---|---|---|---|
| 6,016,185 A * | 1/2000 | Cullman | G03F 7/70358 |
| | | | 355/52 |
| 9,679,793 B2 * | 6/2017 | Zoller | C23C 14/547 |
| 2006/0118263 A1 * | 6/2006 | Silvestrini | G02C 7/165 |
| | | | 164/46 |
| 2011/0194114 A1 * | 8/2011 | Yeo | G01N 21/07 |
| | | | 356/435 |
| 2011/0265583 A1 * | 11/2011 | Scherer | C23C 14/566 |
| | | | 73/864.91 |

* cited by examiner

VAPOR SHIELD REPLACEMENT SYSTEM AND METHOD

PRIORITY CLAIM

The instant application is a continuation application of U.S. application Ser. No. 15/798,827 filed Oct. 31, 2017, which is a non-provisional application claiming priority to provisional application No. 62/512,987 filed May 31, 2017, the entire contents of which are incorporated by reference herein.

BACKGROUND

Integrated circuit (IC) manufacturing often includes operations in which substrates or other objects are secured on stages while one or more processes are executed at or near a top surface of the object. For example, substrates are often annealed after doping and other operations have been executed to form source and drain structures.

In some cases, laser spike annealing (LSA) is performed using stationary equipment under which substrates are manipulated to align to targeted locations. Because annealing involves elevated temperatures that can cause chemical residues to evaporate, some annealing equipment is protected by a shield against the resultant vapor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
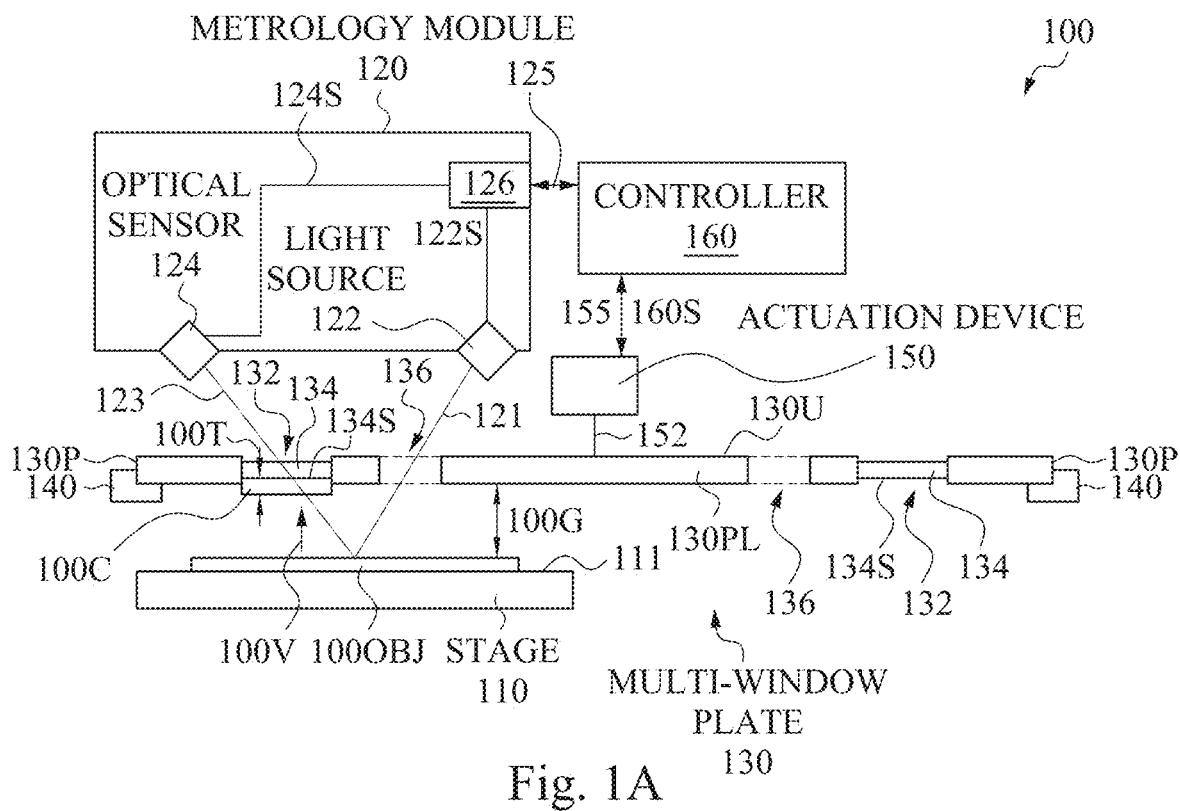
FIGS. 1A-1B are diagrams of a vapor shield replacement system, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a stage supports an object, a light source directs a light beam at the object, an optical sensor detects light emitted and/or reflected from the object in response to the light beam, and a multi-shield plate includes a plate and a plurality of vapor shields mounted at or in a corresponding plurality of apertures formed in the plate. A controller is used to determine if a first vapor shield of the plurality of vapor shields has become coated based on the detected light and, if the first vapor shield is determined to have become coated, cause a second vapor shield of the plurality of vapor shields to replace the first vapor shield of the plurality of vapor shields at a position between the optical sensor and the stage.

Figure 1B:
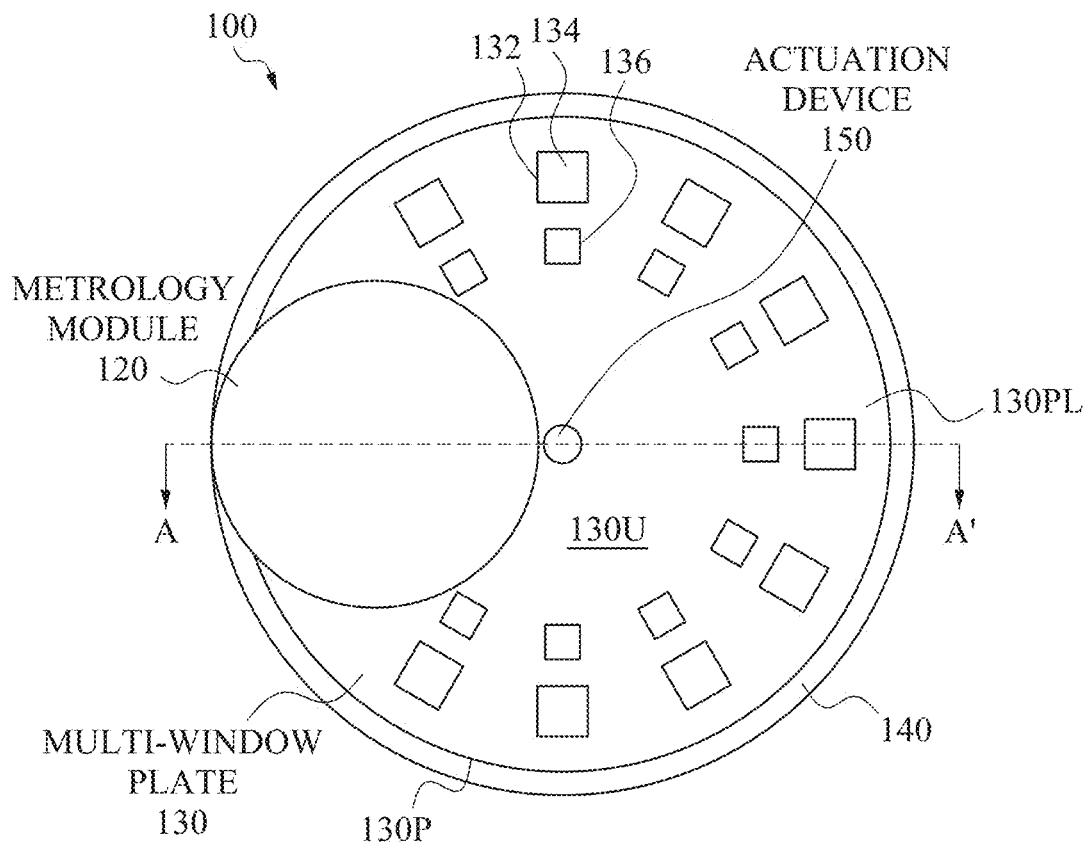

FIGS. 1A and 1B are diagrams of a vapor shield replacement system 100, in accordance with some embodiments. FIG. 1A depicts a cross-sectional view of vapor shield replacement system 100, an object 100OBJ, a vapor 100V, and a coating 100C. FIG. 1B depicts a plan view of vapor shield replacement system 100. The cross-sectional plane depicted in FIG. 1A is indicated by line A-A' in FIG. 1B.

Vapor shield replacement system 100 includes a stage 110, a metrology module 120, a multi-shield plate 130, a guide 140, an actuation device 150, and a controller 160. A communication link 125 communicatively couples metrology module 120 with controller 160, and a communication link 155 communicatively couples actuation device 150 with controller 160.

Stage 110 is a rigid structure, e.g., a disk, configured to support object 100OBJ at one or more locations relative to metrology module 120. In some embodiments, stage 110 is moveable so as to support object 100OBJ at one or more locations relative to metrology module 120.

In the embodiment depicted in FIG. 1A, stage 110 has a substantially planar upper surface 111 capable of supporting object 100OBJ. In some embodiments, upper surface 111 is the only upper surface of stage 110. In some embodiments, stage 110 includes one or more upper surfaces (not shown) in addition to upper surface 111. In some embodiments, upper surface 111 of stage 110 has one or more non-planar features, e.g., protrusions or recesses, that facilitate support of object 100OBJ.

In some embodiments, object 100OBJ is a substrate such as a semiconductor wafer, and upper surface 111 is a smooth surface suitable for securing the substrate. In some embodiments, stage 110 includes one or more components capable of securing object 100OBJ on upper surface 111. In some embodiments, stage 110 includes elements of a vacuum or electrostatic assembly capable of securing object 100OBJ on upper surface 111. In some embodiments, stage 110 includes one or more mechanical elements or assemblies, e.g., clips or fasteners, capable of securing object 100OBJ on upper surface 111.

In some embodiments, upper surface 111 includes one or more holes configured to apply a vacuum for securing object 100OBJ on stage 110. In some embodiments, stage 110 includes one or more ejector pins, and upper surface 111 includes one or more holes configured to allow movement of the ejector pins for removing object 100OBJ from upper surface 111. In some embodiments, stage 110 includes one or more components capable of controlling a temperature of upper surface 111.

In some embodiments, stage 110 has a diameter of about 4-36 inches. In some embodiments, stage 110 has a diameter of about 8-18 inches.

Metrology module 120 is an assembly capable of applying a light beam 121 to object 100OBJ and detecting light 123 emitted and/or reflected from object 100OBJ in response to light beam 121. Metrology module 120 includes a light source 122 capable of directing light beam 121 at object 100OBJ, an optical sensor 124 capable of detecting light 123 emitted and/or reflected from object 100OBJ, and a communication module 126. In some embodiments, metrology module 120 includes one or more additional components (not shown) capable of performing one or more additional functions related to metrology operations including, but not limited to, movement and positioning of metrology module 120, cooling and/or heating, data storage, and signal processing.

Light source 122 is an apparatus configured to direct light beam 121 at object 100OBJ. In some embodiments, light source 122 is capable of generating and directing light beam 121. In some embodiments, light beam 121 is generated by one or more devices (not shown) other than light source 122, and light source 122 is a reflector or similar apparatus capable of redirecting light beam 121 at object 100OBJ from the one or more devices. In some embodiments, light source 122 is one light source of a plurality of light sources.

In some embodiments, light beam 121 is a laser beam and light source 122 includes a laser. In some embodiments, light source 122 includes a carbon dioxide ($CO_2$) laser, and light beam 121 has one or more wavelengths ranging from 9 micrometers ($\mu m$) to 12 $\mu m$. In some embodiments, light source 122 includes a diode laser, and light beam 121 has one or more wavelengths ranging from 0.2 $\mu m$ to 4.0 $\mu m$.

In some embodiments, light source 122 is capable of directing light beam 121 having controllable properties, e.g., intensity levels and/or wavelength compositions.

In the embodiment depicted in FIG. 1A, light source 122 is configured to direct light beam 121 at object 100OBJ responsive to a signal 122S. In some embodiments, light source 122 is configured to direct light beam 121 at object 100OBJ responsive to a signal (not shown) other than signal 122S. In some embodiments, light source 122 is configured to control a property of light beam 121 responsive to a signal such as signal 122S.

In some embodiments, in operation, in response to some or all of light beam 121 interacting with object 100OBJ, object 100OBJ emits some or all of light 123. In some embodiments, in operation, in response to some or all of light beam 121 interacting with object 100OBJ, object 100OBJ reflects some or all of light 123.

Optical sensor 124 is an apparatus configured to detect light 123 and generate a signal 124S based on detected light 123. In some embodiments, light 123 includes light from light beam 121 reflected from object 100OBJ in response to light beam 121. In some embodiments, light 123 has one or more wavelengths corresponding to one or more wavelengths of light beam 121.

In some embodiments, light 123 includes light emitted from object 100OBJ in response to light beam 121. In some embodiments, light 123 has one or more wavelengths different from one or more wavelengths of light beam 121. In some embodiments, light 123 has one or more wavelengths longer than one or more wavelengths of light beam 121.

In some embodiments, light 123 has one or more far-infrared wavelengths. In some embodiments, light 123 has one or more wavelengths ranging from 15 $\mu m$ to 1000 $\mu m$. In some embodiments, light 123 has one or more wavelengths ranging from 500 $\mu m$ to 800 $\mu m$. In some embodiments, light 123 includes one or more of a 500 $\mu m$ wavelength, a 750 $\mu m$ wavelength, or an 800 $\mu m$ wavelength.

In some embodiments, light 123 includes both light reflected from object 100OBJ in response to light beam 121 and light emitted from object 100OBJ in response to light beam 121. In some embodiments, light 123 has one or more wavelengths corresponding to one or more wavelengths of light beam 121 and one or more wavelengths different from one or more wavelengths of light beam 121.

In some embodiments, optical sensor 124 is configured to generate signal 124S indicating an intensity of light 123. In some embodiments, optical sensor 124 is configured to generate signal 124S indicating an overall intensity of light 123. In some embodiments, optical sensor 124 is configured to generate signal 124S indicating an intensity of one or more specific wavelengths of light 123. In some embodiments, optical sensor 124 is configured to generate signal 124S indicating an intensity of one or more of a 500 $\mu m$ wavelength, a 750 $\mu m$ wavelength, or an 800 $\mu m$ wavelength of light 123.

In some embodiments, optical sensor 124 is configured to generate signal 124S indicating a relationship between a first intensity of a first one or more wavelengths of light 123 and a second intensity of a second one or more wavelengths of light 123.

In some embodiments, optical sensor 124 includes a processor or other logic device configured to generate signal 124S based on light 123. In some embodiments, stage 110 and metrology module 120 are components of an LSA system configured to perform an annealing process on object 100OBJ, and signal 124S is generated by the LSA system as part of a feedback loop for controlling a temperature of the annealing process.

Communication module 126 is a component of metrology module 120 configured to output signal 124S on communication link 125. In the embodiment depicted in FIG. 1A, communication module 126 is configured to receive signal 122S on communication link 125. In some embodiments, metrology module 120 includes one or more communication modules (not shown) in addition to communication module 126, and metrology module 120 is configured to receive signal 122S on the one or more additional communication modules.

In some embodiments, communication link 125 includes one or more wires and communication module 126 includes one or more connectors configured to mechanically and electrically couple metrology module 120 with communication link 125. In some embodiments, communication link 125 is a wireless connection and communication module 126 includes a transmitter capable of transmitting signal 124S. In some embodiments, communication link 125 is a wireless connection and communication module 126 includes a receiver capable of receiving signal 122S.

Multi-shield plate 130 is a rigid structure including a plate 130PL having a substantially flat upper surface 130U parallel to a substantially flat lower surface 130L. In some embodiments, upper surface 130U is an entirety of an upper surface of plate 130PL. In some embodiments, plate 130PL includes one or more upper surfaces (not shown) in addition to upper surface 130U. In some embodiments, lower surface 130L is an entirety of a lower surface of plate 130PL. In some embodiments, plate 130PL includes one or more lower surfaces (not shown) in addition to lower surface 130L.

Plate 130PL includes a plurality of windows 132 formed in plate 130PL and extending from upper surface 130U to lower surface 130L. A corresponding plurality of vapor shields 134 is mounted to plate 130PL at locations on plate 103PL corresponding to locations of plurality of windows 132.

In some embodiments, a window 132 extends from upper surface 130U to lower surface 130L having one or more edges perpendicular to upper surface 130U and lower surface 130L. In some embodiments, a window 132 extends from upper surface 130U to lower surface 130L having one or more edges non-perpendicular to upper surface 130U and lower surface 130L. In some embodiments, a window 132 extends from upper surface 130U to lower surface 130L having edges that include one or more protrusions configured to support a vapor shield 134.

Multi-shield plate 130 is configured so that each vapor shield 134 is capable of being positioned between object 100OBJ and optical sensor 124 such that light 123 reflected and/or emitted from object 100OBJ passes through the vapor shield 134 before being received by optical sensor 124. Each vapor shield 134 is thereby capable of being positioned in an optical path of reflected and/or emitted light 123 from object 100OBJ to optical sensor 124.

Each vapor shield 134 includes a material capable of allowing most or all of light 123 to pass through before being received by optical sensor 124. Each vapor shield 134 includes a lower surface 134S such that the vapor shield 134 is capable of preventing most or all of vapor 100V emitted by object 100OBJ from being received by optical sensor 124. In some embodiments, each vapor shield 134 includes quartz.

In the embodiment depicted in FIGS. 1A and 1B, each vapor shield 134 is mounted within a corresponding window 132. In the embodiment depicted in FIG. 1A, a vapor shield 134 is mounted to plate 130PL at a position within a corresponding window 132 between upper surface 130U and lower surface 130L. In some embodiments, a vapor shield 134 is mounted above or on upper surface 130U and over a corresponding window 132. In some embodiments, a vapor shield 134 is mounted below or on lower surface 130L and below a corresponding window 132.

In some embodiments, a single vapor shield structure spans two or more windows 132. In some embodiments in which a single vapor shield structure spans two or more windows 132, each portion of the vapor shield structure corresponding to a window 132 is considered to be a separate vapor shield 134.

By being mounted as discussed above, each vapor shield 134 is configured to prevent passage of a vapor, e.g., vapor 100V, through a corresponding window 132.

In some embodiments, multi-shield plate 130 includes mounting hardware (not shown), e.g., clips, brackets, or fasteners, configured to mount one or more vapor shields 134 to plate 130PL at one or more corresponding windows 132.

In some embodiments, a given vapor shield 134 is fixedly mounted to plate 130PL at or in a corresponding window 132 such that the vapor shield 134 is capable of being removed from plate 130PL only by altering or damaging a component of multi-shield plate 130. In some embodiments, a given vapor shield 134 is removably mounted to plate 130PL at or in a corresponding window 132 such that the vapor shield 134 is capable of being removed from plate 130PL without altering or damaging a component of multi-shield plate 130, such as manually or by using a removal tool. In some embodiments, a given vapor shield 134 is removably mounted to plate 130PL at or in a corresponding window 132 such that the vapor shield 134 is capable of being removed from plate 130PL by removing or adjusting mounting hardware.

In some embodiments, each vapor shield 134 has a shape of a rectangle. In some embodiments, each vapor shield 134 has a shape of a square. In some embodiments, each vapor shield 134 has a uniform shape. In some embodiments, plurality of vapor shields 134 includes vapor shields 134 having varying shapes.

In some embodiments, each vapor shield 134 has a length (not labeled) ranging from 10 millimeters (mm) to 80 mm. In some embodiments, each vapor shield 134 has a length ranging from 15 mm to 25 mm.

In some embodiments, each vapor shield 134 has a width (not labeled) ranging from 1 mm to 25 mm. In some embodiments, each vapor shield 134 has a width ranging from 1 mm to 10 mm.

In some embodiments, each vapor shield 134 has a thickness (not labeled) ranging from 1 mm to 10 mm. In some embodiments, each vapor shield 134 has a thickness ranging from 3 mm to 7 mm.

In the embodiment depicted in FIGS. 1A and 1B, multi-shield plate 130 includes twelve windows 132 and twelve vapor shields 134. In some embodiments, multi-shield plate 130 includes fewer than twelve windows 132 and twelve vapor shields 134. In some embodiments, multi-shield plate 130 includes greater than twelve windows 132 and twelve vapor shields 134.

In some embodiments, multi-shield plate 130 includes at least one aperture 136 aligned with at least one window 132 along an axis such that light beam 121 passes along a light beam path through aperture 136 while being directed at object 100OBJ, and while emitted and/or reflected light 123 is passing through at least one vapor shield 134 along the optical path. In some embodiments, an axis corresponds to one or both of upper surface 130U or lower surface 130L, aperture 136 and at least one window 132 thereby being aligned and spaced along the axis to match a spacing between the light beam path and the optical path.

In the embodiment depicted in FIG. 1B, radial line A-A' is an example of an axis along which a first window 132 is aligned with a first aperture 136. a second window 132 is aligned with a second aperture 136, each of which is obscured by metrology module 120 in the depiction of FIG. 1B.

In some embodiments, multi-shield plate 130 includes a plurality of apertures 136, and each aperture 136 is aligned with a corresponding window 132 along an axis such that light beam 121 passes through the aperture 136 along the light beam path while light 123 is passing through the corresponding vapor shield 134 along the optical path. In some embodiments, multi-shield plate 130 includes a single aperture 136, the single aperture 136 being capable of being aligned with any given window 132 along an axis such that light beam 121 passes through the aperture 136 along the light beam path while light 123 passes through the given vapor shield 134 along the optical path.

In the embodiment depicted in FIG. 1A, each aperture 136 is an opening extending from upper surface 130U to lower surface 130L. In some embodiments, each aperture 136 includes a window pane (not shown) including a material capable of allowing most or all of light beam 121 to pass through along the light beam path. In some embodiments, each aperture 136 includes a window pane that includes quartz.

In the embodiment depicted in FIGS. 1A and 1B, multi-shield plate 130 has a shape of a disk, plurality of windows 132 is distributed adjacent to a perimeter 130S of the disk, and plurality of apertures 136 is distributed within the radial perimeter of plurality of windows 132. In some embodiments, multi-shield plate 130 is a multi-shield plate 230, discussed below with respect to FIGS. 2A and 2B.

In some embodiments, multi-shield plate 130 has a shape of a ring, plurality of windows 132 is distributed adjacent to perimeter 130P, and a single aperture 136 is the center of the ring. In some embodiments, multi-shield plate 130 is a multi-shield plate 330, discussed below with respect to FIGS. 3A and 3B.

In some embodiments, multi-shield plate 130 has a shape of a rectangle, plurality of windows 132 is distributed along a length of the rectangle, and plurality of apertures 136 is distributed alongside plurality of windows 132. In some embodiments, multi-shield plate 130 is a multi-shield plate 430, discussed below with respect to FIGS. 4A and 4B. In some embodiments, multi-shield plate 130 has a shape of a rectangle, and plurality of windows 132 is distributed along a single aperture 136. In some embodiments, multi-shield plate 130 has a shape of a rectangle, plurality of windows 132 is distributed along a length of the rectangle, and multi-shield plate 130 does not include an aperture 136.

Guide 140 is one or more rigid structures capable of providing support for multi-shield plate 130 while allowing multi-shield plate 130 to move horizontally such that each vapor shield 134 is capable of being positioned between optical sensor 124 and stage 110. In the embodiment depicted in FIGS. 1A and 1B, guide 140 is a single structure configured to support multi-shield plate 130 along perimeter 130P while allowing multi-shield plate 130 to rotate within guide 140. In some embodiments, guide 140 is omitted.

In some embodiments, guide 140 includes multiple structures configured to support multi-shield plate 130 along perimeter 130P while allowing multi-shield plate 130 to rotate within guide 140. In some embodiments in which multi-shield plate 130 has a shape of a rectangle, guide 140 includes one or more structures configured to allow multi-shield plate 130 to slide in a horizontal direction such that each vapor shield 134 is capable of being positioned between optical sensor 124 and stage 110 along the optical path.

Vapor shield replacement system 100 is configured so that stage 110, multi-shield plate 130, and guide 140 control positioning of object 100OBJ to have a gap 100G between object 100OBJ and lower surface 134S of a given vapor shield 134.

In some embodiments, vapor shield replacement system 100 does not include guide 140, and vapor shield replacement system 100 is configured so that stage 110, multi-shield plate 130, and actuation device 150 control positioning of object 100OBJ to have gap 100G between object 100OBJ and lower surface 134S of a given vapor shield 134.

In some embodiments, vapor shield replacement system 100 is configured to maintain gap 100G ranging from 1 mm to 3 mm.

Actuation device 150 is an electromechanical assembly configured to receive one or more control signals 160S from controller 160 on communication link 155, and control a positioning of multi-shield plate 130 based on the one or more control signals 160S. Actuation device 150 is capable of controlling positioning of multi-shield plate 130 such that each vapor shield 134 of plurality of vapor shields 134 is capable of being positioned between optical sensor 124 and stage 110 along the optical path.

In some embodiments, actuation device 150 is capable of controlling horizontal positioning of multi-shield plate 130. In some embodiments, actuation device 150 is capable of controlling both horizontal and vertical positioning of multi-shield plate 130.

In the embodiment depicted in FIG. 1A, actuation device 150 is a motor capable of rotating multi-shield plate 130. In some embodiments, actuation device 150 is a stepper motor. In some embodiments, actuation device 150 is a motor capable of rotating multi-shield plate 130 in increments that match each vapor shield 134 of plurality of vapor shields 134 being positioned between optical sensor 124 and stage 110 along the optical path. In some embodiments, actuation device 150 is a motor capable of rotating multi-shield plate 130 by an amount determined by the one or more control signals 160S received from controller 160.

In the embodiment depicted in FIGS. 1A and 1B, actuation device 150 is configured to rotate a shaft 152 mechanically coupled to multi-shield plate 130, thereby causing multi-shield plate 130 to rotate. In some embodiments, actuation device 150 is otherwise mechanically coupled to multi-shield plate 130 so as to be capable of rotating multi-shield plate 130 about an axis. In some embodiments, one or both of actuation device 150 or multi-shield plate 130 includes a gear or wheel by which actuation device 150 is mechanically coupled to multi-shield plate 130 such that multi-shield plate 130 is rotatable about an axis.

In some embodiments in which multi-shield plate 130 has a rectangular shape, one or both of actuation device 150 or multi-shield plate 130 includes a gear or wheel by which actuation device 150 is mechanically coupled to multi-shield plate 130 so as to cause multi-shield plate 130 to slide in a horizontal direction such that each vapor shield 134 is capable of being positioned between optical sensor 124 and stage 110 along the optical path.

In some embodiments, in operation, in response to some or all of light beam 121 interacting with object 100OBJ, object 100OBJ emits vapor 100V. In some embodiments, object 100OBJ is a substrate such as a semiconductor wafer, and vapor 100V includes one or more materials based on a previous manufacturing operation performed on object 100OBJ. In some embodiments, object 100OBJ is a substrate such as a semiconductor wafer, and vapor 100V includes one or more materials based on a photoresist cleaning operation performed on object 100OBJ.

In some embodiments, in operation, in response to vapor 100V being emitted by object 100OBJ, coating 100C is formed on lower surface 134S of a first vapor shield. In some embodiments, coating 100C includes one or more materials related to a previous manufacturing operation performed on object 100OBJ. In some embodiments, coating 100C includes one or more materials related to a photoresist cleaning operation performed on object 100OBJ. In some embodiments, coating 100C includes one or more of sulfate ($SO_4^{2-}$), ammonium ($NH_4^+$), nitrate ($NO_3^-$), or fluoride ($F^-$).

In operation, coating 100C acts to reflect and/or absorb a portion of light 123, thereby reducing an intensity of some or all wavelengths of light 123 received by optical sensor 124. An amount of the reduction in intensity of some or all wavelengths of light 123 increases as a thickness 100T of coating 100C increases. In some embodiments, in operation, thickness 100T increases over time as a result of manufacturing operations performed on a plurality of objects including, e.g., object 100OBJ.

Because signal 124S is generated based on light 123, in operation, the reduction in intensity of some or all wavelengths of light 123 causes signal 124S to change. In some embodiments, in operation, the reduction in intensity of some or all wavelengths of light 123 causes a value represented by signal 124S to decrease. In some embodiments, in operation, the reduction in intensity of some or all wavelengths of light 123 causes a value represented by signal 124S to increase.

In some embodiments, an aspect of a manufacturing operation varies in response to changes in signal 124S based on a reduction in intensity of light 123. Because an amount of such variation is a function of thickness 100T, a threshold value of thickness 100T corresponds to a tolerance level of the aspect of the manufacturing operation.

As a non-limiting example, in some embodiments in which stage 110 and metrology module 120 are components of an LSA system, signal 124S represents a measured temperature of a given annealing process performed on object 100OBJ such that a change in signal 124S based on thickness 100T corresponds to an error in the temperature measurement. In such embodiments, a threshold value of thickness 100T corresponds to a tolerance level of the temperature measurement error for the given annealing process.

By setting a threshold value for thickness 100T that corresponds to a manufacturing tolerance level, an amount of material in coating 100C causing thickness 100T to exceed the threshold value corresponds to a vapor shield 134 being considered to be coated. An amount of material in coating 100C causing thickness 100T to be less than or equal to the threshold value corresponds to a vapor shield 134 being considered to be uncoated. Specific threshold values for thickness 100T on which "coated" or "uncoated" vapor shields 134 are based are therefore a function of a tolerance within the manufacturing environment for which vapor shield replacement system 100 is configured.

In some embodiments, vapor shield replacement system 100 is configured to be operated in a manufacturing environment including multiple tolerance levels that correspond to multiple threshold values for thickness 100T and therefore multiple bases for "coated" and "uncoated" vapor shields 134.

In some embodiments, in operation, particles (not shown) are released from coating 100C and fall onto object 100OBJ, thereby increasing a number of manufacturing defects in object 100OBJ. In some embodiments, a number of particles released from coating 100C increases as thickness 100T increases. In such embodiments, a threshold value for thickness 100T corresponds to a tolerance level in the number of manufacturing defects in object 100OBJ.

Controller 160 is a circuit or assembly configured to receive signal 124S on communication link 125 and determine if thickness 100T of coating 100C on a given vapor shield 134 exceeds a threshold value.

In some embodiments, controller 160 includes a processor. In some embodiments, controller 160 includes processor 602, discussed below with respect to system 600 and FIG. 6.

In some embodiments, controller 160 is configured to determine if a given vapor shield has become coated by comparing signal 124S to a threshold value. In some embodiments, controller 160 is configured to determine if a given vapor shield has become coated by comparing signal 124S to a threshold value that represents the threshold value of thickness 100T.

In some embodiments, controller 160 is configured to compare signal 124S to a predetermined threshold value based on empirical coating data. In some embodiments, controller 160 is configured to determine a threshold value from empirical coating data.

In some embodiments, a plurality of threshold values corresponds to a plurality of manufacturing tolerance levels, and controller 160 is configured to compare signal 124S to one or more threshold values of the plurality of threshold values. In some embodiments, one or more properties of light beam 121, e.g., intensities or wavelength compositions, are variable and correspond to a plurality of threshold values, and controller 160 is configured to compare signal 124S to one or more threshold values of the plurality of threshold values.

In some embodiments, controller 160 is configured to compare signal 124S to one or more threshold values retrieved from a storage device, e.g., computer readable storage medium 604 discussed below with respect to system 600 and FIG. 6. In some embodiments, controller 160 is configured to compare signal 124S to one or more user input threshold values.

In some embodiments, controller 160 is configured to generate signal 122S to cause light source 122 to direct light beam 121 at object 100OBJ. In some embodiments in which vapor shield replacement system 100 is part of a manufacturing processing system such as an LSA system, controller 160 is not configured to generate signal 122S, and signal 122S is generated as part of the manufacturing process.

In some embodiments, controller 160 is configured to receive signal 124S and generate signal 122S on communication link 125. In some embodiments, communication link 125 includes one or more wires and controller 160 includes one or more connectors configured to mechanically and electrically couple controller 160 with communication link 125. In some embodiments, communication link 155 is a wireless connection and controller 160 includes a receiver capable of receiving signal 124S. In some embodiments, communication link 125 is a wireless connection and controller 160 includes a transmitter capable of transmitting signal 122S.

In some embodiments, controller 160 is configured to respond to a determination that a given vapor shield 134 is coated by generating the one or more control signals 160S to cause actuation device 150 to move the given vapor shield 134 away from the position between optical sensor 124 and stage 110 and move a second vapor shield 134 into the position between optical sensor 124 and stage 110.

In some embodiments, controller 160 is configured to cause actuation device 150 to move the given vapor shield 134 away from the position between optical sensor 124 and stage 110 and move a second vapor shield 134 into the position between optical sensor 124 and stage 110 by generating a single indication in the one or more control signals 160S. In some embodiments, a single indication corresponds to a command to a stepper motor to move a single, predefined step.

In some embodiments, controller 160 is configured to control actuation device 150 based on predetermined positioning information. In some embodiments, controller 160 is configured to control actuation device 150 based on user input positioning information. In some embodiments, positioning information corresponds to a spacing between a given vapor shield 134 and an immediately adjacent vapor shield 134.

In some embodiments, controller 160 is configured to cause actuation device 150 to move the given vapor shield 134 away from the position between optical sensor 124 and stage 110 and move the second vapor shield 134 into the position between optical sensor 124 and stage 110 by generating a plurality of indications in the one or more control signals 160S. In some embodiments, the plurality of indications corresponds to the positioning information.

In some embodiments, controller 160 is configured to generate the one or more control signals 160S on communication link 155. In some embodiments, communication link 155 includes one or more wires and controller 160 includes one or more connectors configured to mechanically and electrically couple controller 160 with communication link 155. In some embodiments, communication link 155 is a wireless connection and controller 160 includes a transmitter capable of transmitting the one or more control signals 160S. In some embodiments, communication link 155 is a wireless connection and actuation device 150 includes a receiver capable of receiving the one or more control signals 160S.

In some embodiments, controller 160 is configured to respond to a determination that a given vapor shield 134 is coated by generating an audio and/or visual signal or other vapor shield replacement information for communication to a user.

In some embodiments, vapor shield replacement system 100 includes a user interface, e.g., I/O interface 610 discussed below with respect to system 600 and FIG. 6, configured to receive the one or more user input threshold values. In some embodiments, a user interface is configured to receive the user input positioning information. In some embodiments, a user interface is configured to display a visual signal or other vapor shield replacement information and/or provide an audio signal to a user.

By the configuration discussed above, vapor shield replacement system 100 is capable of, in operation, determining if a given vapor shield 134 is coated based on light 123 and, based on the determination, cause an uncoated vapor shield 134 to replace the coated vapor shield 134, either automatically or manually in response to vapor coating information provided to a user.

Compared to systems that do not replace a coated vapor shield based on a light-based determination of a vapor shield being coated, vapor shield replacement system 100 facilitates prevention of vapor shield coating above a predetermined thickness value. In embodiments in which vapor shield replacement system 100 is part of a manufacturing processing system, prevention of vapor shield coating above a predetermined thickness value reduces processing errors introduced by changes in light 123 used as feedback, thereby increasing yield.

In embodiments in which vapor shield replacement system 100 is part of an LSA system, prevention of vapor shield coating above a predetermined thickness value reduces processing errors introduced by changes in light 123 used as part of a feedback loop for controlling temperatures of the annealing process. In some embodiments, an intensity of light 123 corresponds to an annealing temperature controlled by light beam 121, and prevention of vapor shield coating above a predetermined thickness value reduces errors caused by increased annealing temperatures based on reduced intensity of light 123.

In some embodiments, prevention of vapor shield coating above a predetermined thickness value reduces a number of manufacturing defects caused by particles released from the coating.

Compared to systems that do not replace a coated vapor shield based on a light-based determination of a vapor shield being coated, vapor shield replacement system 100 avoids operator or technician time needed to manually determine that a vapor shield is coated. In embodiments in which vapor shield replacement system 100 automatically replaces a coated vapor shield 134 with an uncoated vapor shield 134, system down-time and operator time are reduced compared to systems in which a coated vapor shield is manually replaced with an uncoated vapor shield.

By including multi-shield plate 130, a frequency of plate replacement for vapor shield replacement system 100 is reduced compared to systems that include a plate with a single vapor shield. Accordingly, both system down-time and operator time needed for plate replacement are reduced in vapor shield replacement system 100 compared to systems that include a plate with a single vapor shield.

Figure 2A:
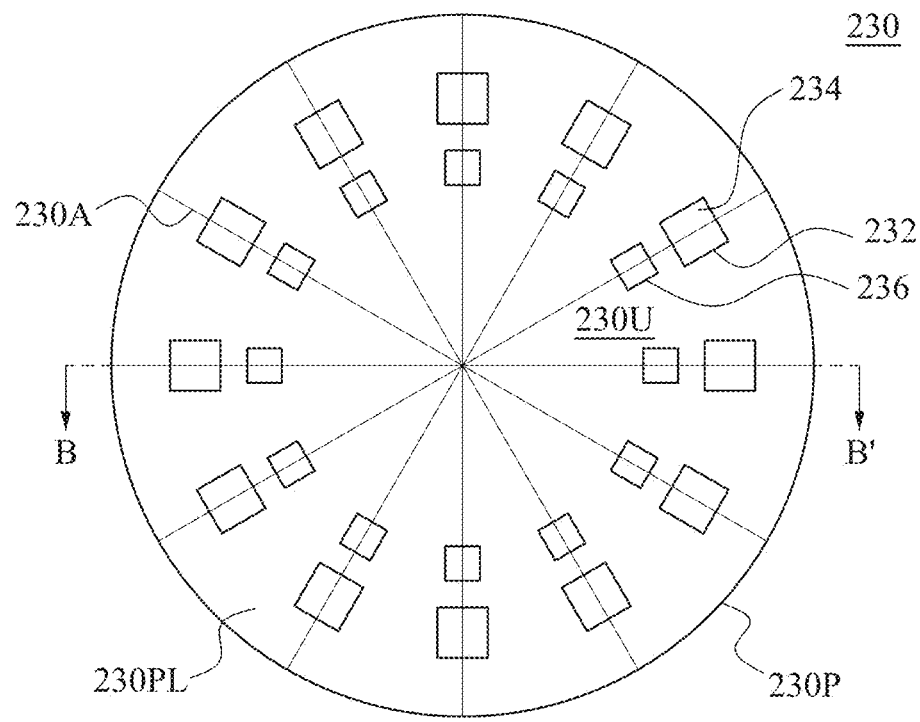
FIGS. 2A-2B are diagrams of a multi-shield plate, in accordance with some embodiments.
Figure 2B:
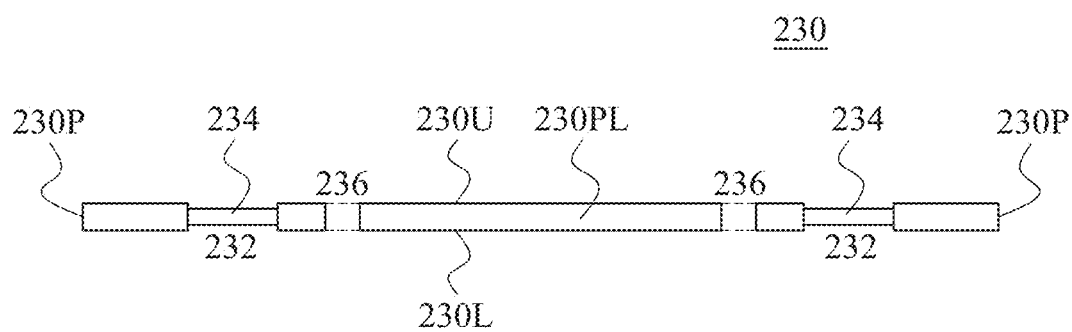

FIGS. 2A and 2B are diagrams of multi-shield plate 230, in accordance with some embodiments. Multi-shield plate 230 is usable as multi-shield plate 130, discussed above with respect to vapor shield replacement system 100 and FIGS. 1A and 1B. FIG. 2A depicts a plan view of multi-shield plate 230, and FIG. 2B depicts a cross-sectional view of multi-shield plate 230 along a plane indicated by line B-B' in FIG. 2A.

Multi-shield plate 230 includes a plate 230PL, an upper surface 230U, a lower surface 230L, windows 232, vapor shields 234, apertures 236, and perimeter 230P, which correspond to plate 130PL, upper surface 130U, lower surface 130L, windows 132, vapor shields 134, apertures 136, and perimeter 130P, respectively, of multi-shield plate 130, discussed above with respect to vapor shield replacement system 100 and FIGS. 1A and 1B.

Multi-shield plate 230 also includes axes 230A which intersect at a center of perimeter 230P. Each window 232 aligns with a corresponding aperture 236 along an axis 230A. In the embodiment depicted in FIG. 2A, multi-shield plate 230 includes six axes 230A. In some embodiments, multi-shield plate 230 includes fewer than six axes 230A. In some embodiments, multi-shield plate 230 includes greater than six axes 230A.

In the embodiment depicted in FIGS. 2A and 2B, multi-shield plate 230 includes twelve windows 232, twelve vapor shields 234, and twelve apertures 236. In some embodiments, multi-shield plate 230 includes fewer than twelve windows 232, twelve vapor shields 234, and twelve apertures 236. In some embodiments, multi-shield plate 230 includes greater than twelve windows 232, twelve vapor shields 234, and twelve apertures 236.

Multi-shield plate 230 is thereby configured as a rotatable circular plate such that, in operation, rotation of multi-shield plate 230 by an amount corresponding to a spacing of windows 232 along perimeter 230P causes a first vapor shield 234 at a given position to be replaced by a second vapor shield 234 at the given position.

By the configuration discussed above, multi-shield plate 230, used in a vapor shield replacement system, e.g., vapor shield replacement system 100, enables realization of the advantages discussed above with respect to vapor shield replacement system 100.

Figure 3A:
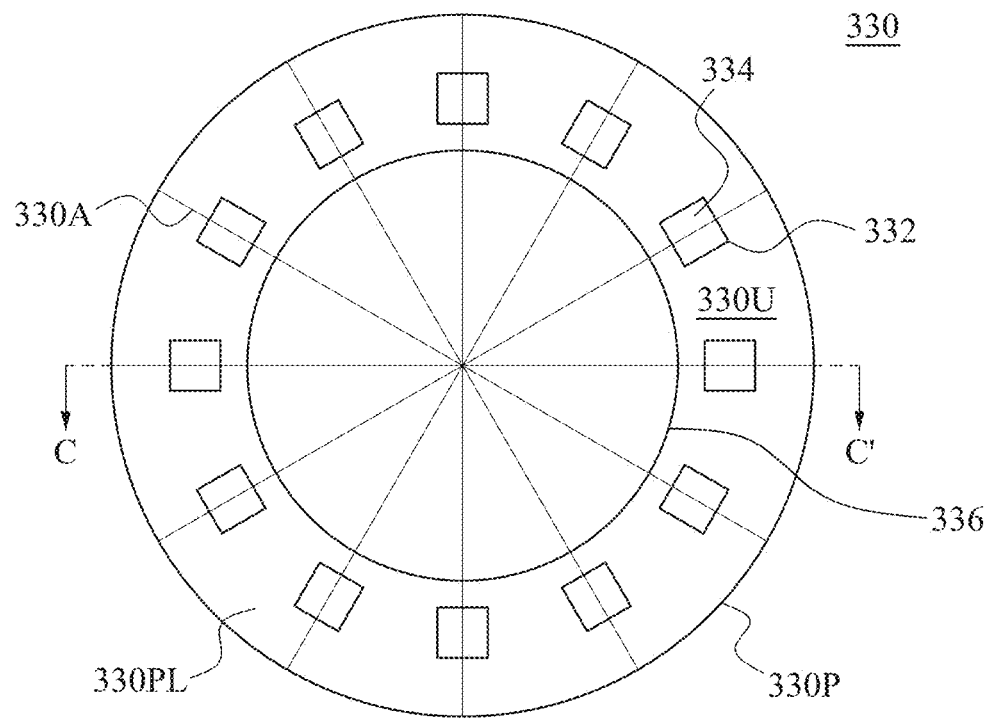
FIGS. 3A-3B are diagrams of a multi-shield plate, in accordance with some embodiments.
Figure 3B:
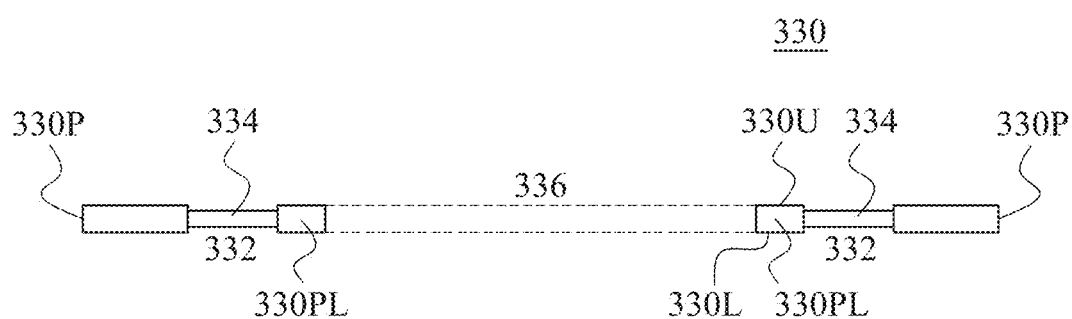

FIGS. 3A and 3B are diagrams of multi-shield plate 330, in accordance with some embodiments. Multi-shield plate 330 is usable as multi-shield plate 130, discussed above with respect to vapor shield replacement system 100 and FIGS. 1A and 1B. FIG. 3A depicts a plan view of multi-shield plate 330, and FIG. 3B depicts a cross-sectional view of multi-shield plate 330 along a plane indicated by line C-C' in FIG. 3A.

Multi-shield plate 330 includes a plate 330PL, an upper surface 330U, a lower surface 330L, windows 332, vapor shields 334, perimeter 330P, and axes 330A, which correspond to plate 230PL, upper surface 230U, lower surface 230L, windows 232, vapor shields 234, perimeter 230P, and axes 230A, of multi-shield plate 230, discussed above with respect to FIGS. 2A and 2B.

Multi-shield plate 330 differs from multi-shield plate 230 by including a single aperture 336 instead of a plurality of apertures 236. Aperture 336 is centered within perimeter 330P such that each window 132 aligns with aperture 336 along an axis 330A. In the embodiment depicted in FIG. 3A, multi-shield plate 330 includes six axes 330A. In some embodiments, multi-shield plate 330 includes fewer than six axes 330A. In some embodiments, multi-shield plate 330 includes greater than six axes 330A.

In the embodiment depicted in FIGS. 3A and 3B, multi-shield plate 330 includes twelve windows 332 and twelve vapor shields 334. In some embodiments, multi-shield plate 330 includes fewer than twelve windows 332 and twelve vapor shields 334. In some embodiments, multi-shield plate 330 includes greater than twelve windows 332 and twelve vapor shields 334.

Multi-shield plate 330 is thereby configured as a rotatable circular plate such that, in operation, rotation of multi-shield plate 330 by an amount corresponding to a spacing of windows 332 along perimeter 330P causes a first vapor shield 334 at a given position to be replaced by a second vapor shield 334 at the given position.

By the configuration discussed above, multi-shield plate 330, used in a vapor shield replacement system, e.g., vapor shield replacement system 100, enables realization of the advantages discussed above with respect to vapor shield replacement system 100.

Figure 4A:
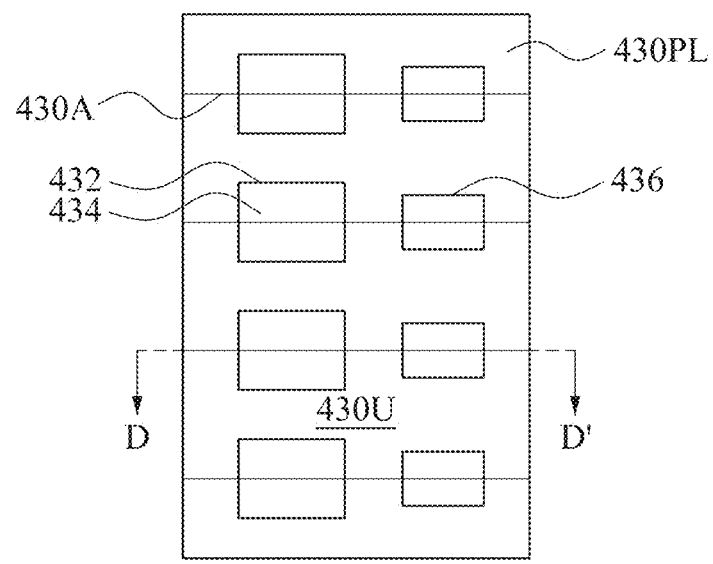
FIGS. 4A-4B are diagrams of a multi-shield plate, in accordance with some embodiments
Figure 4B:
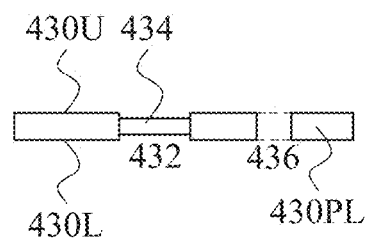

FIGS. 4A and 4B are diagrams of multi-shield plate 430, in accordance with some embodiments. Multi-shield plate 430 is usable as multi-shield plate 130, discussed above with respect to vapor shield replacement system 100 and FIGS. 1A and 1B. FIG. 4A depicts a plan view of multi-shield plate 430, and FIG. 4B depicts a cross-sectional view of multi-shield plate 430 along a plane indicated by line D-D' in FIG. 4A.

Multi-shield plate 430 includes a plate 430PL, an upper surface 430U, a lower surface 430L, windows 432, vapor shields 434, and apertures 436, which correspond to plate 130PL, upper surface 130U, lower surface 130L, windows 132, vapor shields 134, and apertures 136, respectively, of multi-shield plate 130, discussed above with respect to vapor shield replacement system 100 and FIGS. 1A and 1B.

Multi-shield plate 430 has a rectangular shape and includes axes 430A aligned parallel to each other and across multi-shield 430. Each window 432 is aligned with a corresponding aperture 436 along an axis 430A.

Multi-shield plate 430 is thereby configured as a movable rectangular plate such that, in operation, movement of multi-shield plate 430 by an amount corresponding to a spacing of windows 432 along a length of multi-shield plate 430 causes a first vapor shield 434 at a given position to be replaced by a second vapor shield 434 at the given position.

By the configuration discussed above, multi-shield plate 430, used in a vapor shield replacement system, e.g., vapor shield replacement system 100, enables realization of the advantages discussed above with respect to vapor shield replacement system 100.

Figure 5:
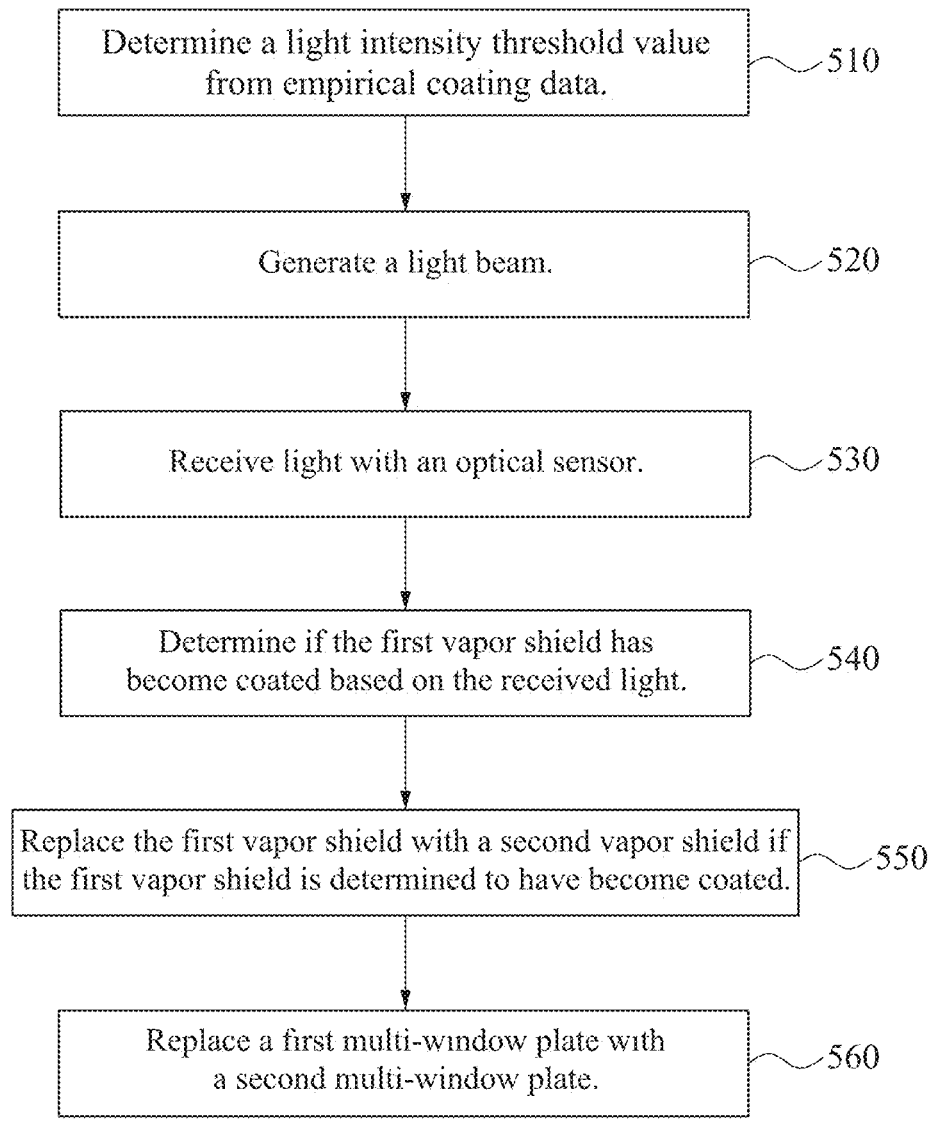
FIG. 5 is a flowchart of a method of replacing a vapor shield, in accordance with some embodiments.

FIG. 5 is a flowchart of a method 500 of controlling replacement of a vapor shield, in accordance with one or more embodiments. Method 500 is implemented using a vapor shield replacement system such as vapor shield replacement system 100, discussed above with respect to FIGS. 1A and 1B, and with a multi-shield plate such as multi-shield plates 130, 230, 330, and 430, discussed above with respect to FIGS. 1A and 1B, 2A and 2B, 3A and 3B, and 4A and 4B, respectively.

At operation 510, in some embodiments, a light intensity threshold value is determined from empirical coating data. In some embodiments, determining the light intensity threshold value includes determining a threshold value based on measurements of intensity values of light, e.g., light 123, received by an optical sensor such as optical sensor 124 discussed above with respect to vapor shield replacement system 100 and FIGS. 1A and 1B.

In some embodiments, determining the light intensity threshold value includes correlating light intensity values with thickness values of one or more vapor shield coatings. In some embodiments, determining the light intensity threshold value includes correlating light intensity values with values of one or more processing parameters of a manufacturing process. In some embodiments, determining the light intensity threshold value includes correlating light intensity values with values of one or more temperatures of an annealing process. In some embodiments, determining the light intensity threshold value includes correlating thickness values of one or more vapor shield coatings with values of one or more temperatures of an annealing process.

In some embodiments, determining the light intensity threshold value includes determining a plurality of light intensity threshold values corresponding to a plurality of manufacturing tolerances. In some embodiments, determining the light intensity threshold value includes determining a plurality of light intensity threshold values corresponding to a plurality of values of one or more properties of a light beam produced by a light source.

In some embodiments, determining the light intensity threshold value includes storing one or more threshold values in a storage medium such as computer readable storage medium 604, discussed below with respect to system 600 and FIG. 6.

In some embodiments, determining the light intensity threshold value includes determining the light intensity threshold value using a processor such as processor 602, discussed below with respect to system 600 and FIG. 6.

At operation 520, in some embodiments, a light beam is generated. In some embodiments, generating the light beam includes generating the light beam using a light source such as light source 122, discussed above with respect to vapor shield replacement system 100 and FIGS. 1A and 1B.

In some embodiments, generating the light beam includes generating a signal using a controller such as controller 160, discussed above with respect to vapor shield replacement system 100 and FIGS. 1A and 1B. In some embodiments, generating the light beam includes generating a signal using a manufacturing processing system. In some embodiments, generating the light beam includes generating a signal using an LSA system.

In some embodiments, generating the light beam includes directing the light beam at an object such as object 100OBJ, discussed above with respect to vapor shield replacement system 100 and FIGS. 1A and 1B. In some embodiments, generating the light beam includes directing the light beam at a substrate such as a semiconductor wafer as part of a manufacturing process. In some embodiments, generating the light beam includes directing a laser beam at a substrate such as a semiconductor wafer as part of a laser annealing process.

At operation 530, light is received with an optical sensor, the light having passed through a first vapor shield after having been emitted and/or reflected from an object. In some embodiments, receiving the light with an optical sensor includes receiving light, e.g., light 123, using optical sensor 124, discussed above with respect to vapor shield replacement system 100 and FIGS. 1A and 1B.

In some embodiments, receiving the light with an optical sensor includes receiving the light having passed through a vapor shield of a multi-shield plate. In some embodiments, receiving the light with an optical sensor includes receiving the light having passed through a vapor shield 134 of multi-shield plate 130, discussed above with respect to vapor shield replacement system 100 and FIGS. 1A and 1B.

In some embodiments, receiving the light with an optical sensor includes receiving the light having passed through a vapor shield 234 of multi-shield plate 230, discussed above with respect to FIGS. 2A and 2B. In some embodiments, receiving the light with an optical sensor includes receiving the light having passed through a vapor shield 334 of multi-shield plate 330, discussed above with respect to FIGS. 3A and 3B. In some embodiments, receiving the light with an optical sensor includes receiving the light having passed through a vapor shield 434 of multi-shield plate 430, discussed above with respect to FIGS. 4A and 4B.

In some embodiments, receiving the light with an optical sensor includes receiving the light as part of a manufacturing process. In some embodiments, receiving the light with an optical sensor includes receiving the light as part of a temperature feedback loop of an annealing process.

In some embodiments, receiving the light with an optical sensor includes generating a signal indicative of an intensity of the received light. In some embodiments, receiving the light with an optical sensor includes generating signal 124S, discussed above with respect to vapor shield replacement system 100 and FIGS. 1A and 1B.

At operation 540, a determination is made if the first vapor shield has become coated based on the received light. In some embodiments, determining if the first vapor shield has become coated includes determining if the first vapor shield has become coated using controller 160, discussed above with respect to vapor shield replacement system 100 and FIGS. 1A and 1B.

In some embodiments, determining if the first vapor shield has become coated includes comparing an intensity of the received light to a threshold value. In some embodiments, determining if the first vapor shield has become coated includes comparing the intensity of the received light to an empirically determined threshold value.

In some embodiments, determining if the first vapor shield has become coated includes comparing a value derived from an intensity of the received light to a threshold value. In some embodiments, determining if the first vapor shield has become coated includes comparing an annealing temperature value derived from an intensity of the received light to a threshold value.

In some embodiments, determining if the first vapor shield has become coated includes concluding that the first vapor shield has become coated based on the intensity of the received light being below the threshold value. In some embodiments, determining if the first vapor shield has become coated includes concluding that the first vapor shield has become coated based on the value derived from the intensity of the received light being above the threshold value.

In some embodiments, determining if the first vapor shield has become coated includes concluding that the first vapor shield has become coated based on the value derived from the intensity of the received light being below the threshold value. In some embodiments, determining if the first vapor shield has become coated includes concluding that the first vapor shield has become coated based on an annealing temperature value derived from the intensity of the received light being below the threshold value.

In some embodiments, determining if the first vapor shield has become coated includes retrieving a threshold value, e.g., one or more threshold values 620, from a storage medium such as computer readable storage medium 604, discussed below with respect to system 600 and FIG. 6. In some embodiments, determining if the first vapor shield has become coated includes receiving the threshold value from a user interface such as I/O interface 610, discussed below with respect to system 600 and FIG. 6.

At operation 550, the first vapor shield is replaced with a second vapor shield if the first vapor shield is determined to have become coated. In some embodiments, replacing the first vapor shield with a second vapor shield includes replacing a first vapor shield 134 with a second vapor shield 134, discussed above with respect to vapor shield replacement system 100 and FIGS. 1A and 1B.

In some embodiments, replacing the first vapor shield with a second vapor shield includes replacing a first vapor shield 234 with a second vapor shield 234 of multi-shield plate 230, discussed above with respect to FIGS. 2A and 2B. In some embodiments, replacing the first vapor shield with a second vapor shield includes replacing a first vapor shield 334 with a second vapor shield 334 of multi-shield plate 330, discussed above with respect to FIGS. 3A and 3B. In some embodiments, replacing the first vapor shield with a second vapor shield includes replacing a first vapor shield 434 with a second vapor shield 434 of multi-shield plate 430, discussed above with respect to FIGS. 4A and 4B.

In some embodiments, replacing the first vapor shield with a second vapor shield includes moving the first vapor shield away from a position below the optical sensor, and simultaneously moving the second vapor shield to the position. In some embodiments, replacing the first vapor shield with a second vapor shield includes moving the first vapor shield away from a position below optical sensor 124, and simultaneously moving the second vapor shield to the position under optical sensor 124, discussed above with respect to vapor shield replacement system 100 and FIGS. 1A and 1B.

In some embodiments, replacing the first vapor shield with the second vapor shield includes rotating a rotatable plate. In some embodiments, replacing the first vapor shield with a second vapor shield includes rotating multi-shield plate 130, discussed above with respect to vapor shield replacement system 100 and FIGS. 1A and 1B.

In some embodiments, replacing the first vapor shield with a second vapor shield includes rotating multi-shield plate 230, discussed above with respect to FIGS. 2A and 2B. In some embodiments, replacing the first vapor shield with a second vapor shield includes rotating multi-shield plate 330, discussed above with respect to FIGS. 3A and 3B.

In some embodiments, replacing the first vapor shield with the second vapor shield includes rotating a rotatable plate with a stepper motor. In some embodiments, replacing the first vapor shield with the second vapor shield includes rotating a rotatable plate using actuation device 150, discussed above with respect to vapor shield replacement system 100 and FIGS. 1A and 1B.

In some embodiments, replacing the first vapor shield with a second vapor shield includes generating a signal. In some embodiments, replacing the first vapor shield with a second vapor shield includes generating one or more control signals 160S using controller 160, discussed above with respect to vapor shield replacement system 100 and FIGS. 1A and 1B.

In some embodiments, replacing the first vapor shield with a second vapor shield includes generating a signal including positioning information for the second vapor shield relative to the first vapor shield. In some embodiments, replacing the first vapor shield with a second vapor shield includes retrieving positioning information, e.g., positioning information 622, from a storage medium such as storage medium 604, discussed above with respect to system 600 and FIG. 6.

In some embodiments, replacing the first vapor shield with a second vapor shield includes receiving positioning information from a user interface such as I/O interface 610, discussed above with respect to system 600 and FIG. 6.

In some embodiments, replacing the first vapor shield with a second vapor shield includes communicating a signal to a user interface such as I/O interface 610, discussed above with respect to system 600 and FIG. 6.

In some embodiments, replacing the first vapor shield with the second vapor shield includes removing a coated vapor shield from the multi-shield plate and replacing the coated vapor shield with an uncoated vapor shield in the multi-shield plate.

At operation 560, in some embodiments, a first multi-shield plate is replaced with a second multi-shield plate. In some embodiments, replacing the first multi-shield plate with the second multi-shield plate includes, for each vapor shield of the first multi-shield plate, determining, by operation 540, that each vapor shield of the first multi-shield plate has become coated.

In some embodiments, replacing the first multi-shield plate with the second multi-shield plate includes replacing a first multi-shield plate 130 with a second multi-shield plate 130, discussed above with respect to vapor shield replacement system 100 and FIGS. 1A and 1B.

In some embodiments, replacing the first multi-shield plate with the second multi-shield plate includes replacing a first multi-shield plate 230 with a second multi-shield plate 130, discussed above with respect to FIGS. 2A and 2B. In some embodiments, replacing the first multi-shield plate with the second multi-shield plate includes replacing a first multi-shield plate 330 with a second multi-shield plate 330, discussed above with respect to FIGS. 3A and 3B. In some embodiments, replacing the first multi-shield plate with the second multi-shield plate includes replacing a first multi-shield plate 430 with a second multi-shield plate 430, discussed above with respect to FIGS. 2A and 4B.

Executing the operations of method 500 enables determining if a given vapor shield is coated based on light received by an optical sensor, and, based on the determination, cause an uncoated vapor shield to replace the coated vapor shield, either automatically or manually in response to vapor coating information communicated to a user.

Compared to methods that do not replace a coated vapor shield based on a light-based determination of a vapor shield being coated, method 500 facilitates prevention of vapor shield coating above a predetermined thickness. In embodiments in which method 500 is integrated with a manufacturing process, prevention of vapor shield coating above a predetermined thickness reduces processing errors introduced by changes in light used as feedback, thereby increasing yield.

In embodiments in which method 500 is integrated with a laser annealing process, prevention of vapor shield coating above a predetermined thickness reduces processing errors introduced by changes in light used as part of a feedback loop for controlling temperatures of the annealing process. In some embodiments, an intensity of the light corresponds to an annealing temperature controlled by the light beam, and prevention of vapor shield coating above a predetermined thickness reduces errors caused by increased annealing temperatures based on reduced intensity of the light.

In some embodiments, prevention of vapor shield coating above a predetermined thickness using method 500 reduces a number of manufacturing defects caused by particles released from the coating.

Compared to methods that do not replace a coated vapor shield based on a light-based determination of a vapor shield being coated, method 500 avoids operator or technician time needed to manually determine that a vapor shield is coated. In embodiments in which method 500 automatically replaces a coated vapor shield with an uncoated vapor shield, system down-time and operator time are reduced compared to methods in which a coated vapor shield is manually replaced with an uncoated vapor shield.

By including operations using multi-shield plates, method 500 reduces a frequency of plate replacement compared to methods based on plates with a single vapor shield. Accordingly, both system down-time and operator time needed for plate replacement are reduced in vapor shield replacement.

Figure 6:
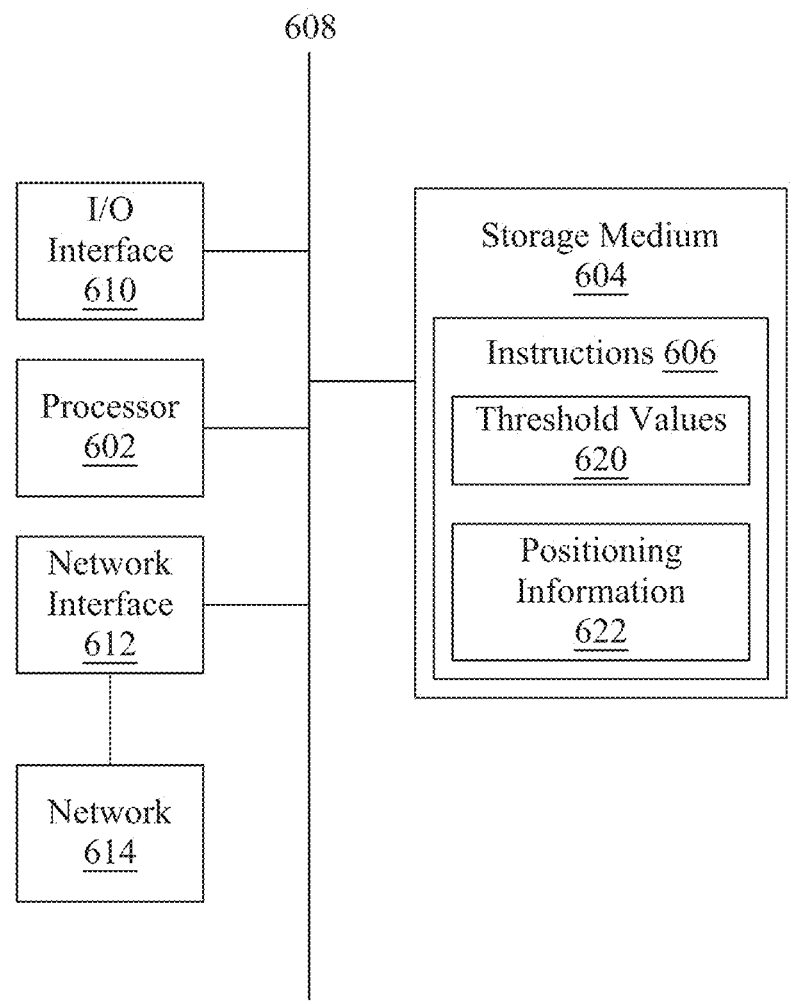
FIG. 6 is a schematic view of a system for controlling replacement of a vapor shield, in accordance with some embodiments.

FIG. 6 is a schematic view of a system 600 for controlling replacement of a vapor shield, in accordance with some embodiments. In some embodiments, system 600 is part of a wafer processing system. In some embodiments, system 600 is part of an LSA system.

System 600 includes a hardware processor 602 and a non-transitory, computer readable storage medium 604 encoded with, i.e., storing, the computer program instructions 606, i.e., a set of executable instructions. Instructions 606 include instructions for determining vapor shield coating and replacing coated vapor shields. The processor 602 is electrically coupled with the computer readable storage medium 604 via a bus 608. The processor 602 is also electrically coupled with an I/O interface 610 by bus 608. A network interface 612 is also electrically connected to the processor 602 via bus 608. Network interface 612 is connected to a network 614, so that processor 602 and computer readable storage medium 604 are capable of connecting to external elements via network 614. The processor 602 is configured to execute the computer program instructions 606 encoded in the computer readable storage medium 604 in order to cause system 600 to be usable for performing a portion or all of the operations as described in method 500.

In some embodiments, the processor 602 is a central processing unit (CPU), a multi-processor, a distributed processing system, an application specific integrated circuit (ASIC), and/or a suitable processing unit.

In some embodiments, the computer readable storage medium 604 is an electronic, magnetic, optical, electromagnetic, infrared, and/or a semiconductor system (or apparatus or device) for storing instructions and/or data in a non-transitory manner. For example, the computer readable storage medium 604 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 604 includes a compact disk-read only memory (CD-ROM), a compact disk-read/write (CD-R/W), and/or a digital video disc (DVD).

In some embodiments, the computer readable storage medium 604 stores the computer program instructions 606 configured to cause system 600 to perform a portion or all of method 500. In some embodiments, the computer readable storage medium 604 also stores information needed for performing method 500 as well as information generated during the performance of the method 500, such as one or more threshold values 620, positioning information 622, and/or a set of executable instructions to perform one or more operations of method 500.

I/O interface 610 is coupled with external circuitry. In some embodiments, I/O interface 610 includes a keyboard, keypad, mouse, trackball, trackpad, and/or cursor direction keys for communicating information and/or commands to processor 602. In some embodiments, I/O interface 610 includes a display, signal light, and/or audio device for communicating information from processor 602.

Network interface 612 allows system 600 to communicate with network 614, to which one or more other computer systems are connected. Network interface 612 includes wireless network interfaces such as BLUETOOTH, WIFI, WIMAX, GPRS, or WCDMA; or wired network interface such as ETHERNET, USB, or IEEE-1394. In some embodiments, method 500 is implemented in two or more systems 600, and information such as one or more threshold values 620 and/or positioning information 622 are exchanged between different systems 600 via network 614.

System 600 is configured to receive information related to determining vapor shield coating and replacing coated vapor shields. The information is transferred to processor 602 via bus 608 and is then stored in computer readable storage medium 604 as one or more threshold values 620 and/or positioning information 622. In some embodiments, the one or more threshold values 620 are accessed in operation 540 (FIG. 5). In some embodiments, the positioning information 622 is accessed in operation 550 (FIG. 5).

By being configured to execute a portion or all of method 500, system 600 enables the realization of the advantages discussed above with respect to vapor shield replacement system 100, method 500, and FIGS. 1A-5.

In some embodiments, a system includes a light source configured to direct a light beam at an object; an optical sensor configured to be positioned above the object, and a multi-shield plate positioned between the object and the optical sensor. The multi-shield plate includes a plate having a substantially flat upper surface and a substantially flat lower surface and a window formed in the plate and extending through the plate from the upper surface to the lower surface, the window having a vapor shield fixedly mounted therein, wherein the vapor shield is positioned between the object and the optical sensor so that light reflected from the object passes through the vapor shield before being received by the optical sensor. The system further includes an actuation device mechanically coupled to the multi-shield plate, and a controller communicatively coupled with the actuation device. The controller is configured to determine if the vapor shield has become coated based on the detected light; and in response to determining that the vapor shield has become coated based on the detected light, cause the actuation device to replace the vapor shield with an other vapor shield.

In some embodiments, a system includes a stage configured to support an object, a light source configured to direct a light beam at the object, an optical sensor positioned above the stage and configured to detect light emitted and/or reflected from the object in response to the light beam, and a multi-shield plate. The multi-shield plate includes a plate having a substantially flat upper surface and a substantially flat lower surface, a plurality of windows formed in the plate and extending through the plate from the upper surface to the lower surface, and a plurality of vapor shields mounted to the plate, each vapor shield of the plurality of vapor shields configured to prevent passage of a vapor through a corresponding window of the plurality of windows. The system also includes an actuation device mechanically coupled to the multi-shield plate and a controller communicatively coupled with the actuation device. The controller is configured to determine if a first vapor shield of the plurality of vapor shields in a position along an optical path between the optical sensor and the stage has become coated based on the detected light, and, if the first vapor shield is determined to have become coated, cause the actuation device to replace first vapor shield of the plurality of vapor shields with a second vapor shield of the plurality of vapor shields.

In some embodiments, a method of replacing a vapor shield includes receiving light with an optical sensor, wherein a first vapor shield is positioned between an object and the optical sensor so that light reflected from the object passes through the first vapor shield before being received by the optical sensor; determining if the first vapor shield has become coated based on the received light; and replacing the first vapor shield with a second vapor shield if the first vapor shield is determined to have become coated.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system comprising:
   a light source configured to direct a light beam at an object;
   an optical sensor configured to be positioned above the object;
   a multi-shield plate positioned between the object and the optical sensor, comprising:
   a plate having a substantially flat upper surface and a substantially flat lower surface; and
   a first window formed in the plate and extending through the plate from the upper surface to the lower surface, the first window having a first vapor shield fixedly mounted therein, wherein the first vapor shield is positioned between the object and the optical sensor so that light reflected from the object passes through the first vapor shield before being received by the optical sensor;

an actuation device mechanically coupled to the multi-shield plate; and a controller communicatively coupled with the actuation device, the controller configured to:
determine if the first vapor shield has become coated based on the received light; and
in response to determining that the first vapor shield has become coated based on the received light, cause the actuation device to replace the first vapor shield with an other vapor shield.

2. The system of claim 1, further comprising a stage wherein the multi-shield plate further has formed therein a plurality of apertures and a plurality of vapor shields, and the system is configured so that:
when the first vapor shield of the plurality of vapor shields is in a position along an optical path, a first aperture of the plurality of apertures is in a position along a light beam path between the light source and the stage, thereby allowing the light beam to pass through the first aperture, and
when a second vapor shield of the plurality of vapor shields is in the position along the optical path, a second aperture of the plurality of apertures is in the position along the light beam path.

3. The system of claim 1, further comprising a plurality of vapor shields that includes the first vapor shield and a second vapor shield wherein the system comprises a plurality of windows that includes the first window and wherein:
the plate is a rotatable circular plate having a perimeter,
the plurality of windows is distributed adjacent to the perimeter, and
the actuation device is configured to replace the first vapor shield and the second vapor shield of the plurality of vapor shields by causing the rotatable circular plate to rotate.

4. The system of claim 3, wherein the actuation device comprises a stepper motor configured to rotate the rotatable circular plate responsive to the controller.

5. The system of claim 1, wherein
the optical sensor is configured to generate a signal based on the received light, and
the controller is configured to determine if the first vapor shield has become coated by comparing the signal to a threshold value.

6. The system of claim 5, wherein the threshold value is a predetermined value based on empirical coating data.

7. The system of claim 1, further comprising a guide within which the multi-shield plate is moveable.

8. The system of claim 1, wherein the first vapor shield comprises quartz.

9. The system of claim 1, wherein
the light source and the optical sensor are components of a laser annealing system configured to perform an annealing process on the object.

10. A method of replacing a vapor shield, the method comprising:
receiving light from a light source with an optical sensor, wherein a first vapor shield is positioned between an object and the optical sensor so that light reflected from the object passes through the first vapor shield before being received by the optical sensor and wherein the light source and the optical sensor are above the first vapor shield;
determining if the first vapor shield has become coated based on the received light; and
replacing the first vapor shield with a second vapor shield if the first vapor shield is determined to have become coated.

11. The method of claim 10, wherein the determining if the first vapor shield has become coated comprises comparing an intensity of the received light to a threshold value.

12. The method of claim 11, further comprising determining the threshold value from empirical coating data.

13. The method of claim 10, wherein the replacing the first vapor shield with the second vapor shield comprises:
moving the first vapor shield away from a position along an optical path, and
simultaneously positioning the second vapor shield between the object and the optical sensor so that light reflected from the object passes through the second vapor shield before being received by the optical sensor.

14. The method of claim 10, wherein
the first vapor shield and the second vapor shield are positioned adjacent to a perimeter of a rotatable plate, and
the replacing the first vapor shield with the second vapor shield comprises rotating the rotatable plate.

15. The method of claim 10, wherein the object is a semiconductor wafer and the optical sensor provides temperature feedback for an annealing process on the semiconductor wafer.

16. A multi-shield plate comprising:
a plate having a substantially flat upper surface and a substantially flat lower surface;
a plurality of windows and a plurality of vapor shields mounted to the plurality of windows, wherein each window of the plurality of windows is formed in the plate and extends through the plate from the upper surface to the lower surface, the plurality of vapor shields is configured to prevent passage of a vapor through the plurality of windows; and
an aperture formed in the plate, the aperture comprising an opening extending from the upper surface to the lower surface and being aligned with a first window of the plurality of windows along an axis corresponding to the upper surface.

17. The multi-shield plate of claim 16, wherein
the aperture is one aperture of a plurality of apertures formed in the plate,
the axis is one axis of a plurality of axes corresponding to the upper surface, and
each aperture of the plurality of apertures is aligned with a corresponding window of the plurality of windows along a corresponding axis of the plurality of axes.

18. The multi-shield plate of claim 17, wherein
the multi-shield plate has a shape of a disk,
the plurality of windows is distributed adjacent to a perimeter of the disk, and
each axis of the plurality of axes corresponds to a radius of the disk.

19. The multi-shield plate of claim 17, wherein each vapor shield of the plurality of vapor shields is mounted to the plate at a position between the upper surface and the lower surface.

20. The multi-shield plate of claim 16, wherein each vapor shield of the plurality of vapor shields comprises quartz.

* * * * *